(12) United States Patent
Yamamoto

(10) Patent No.: US 6,911,684 B2
(45) Date of Patent: Jun. 28, 2005

(54) IMAGE SENSOR HAVING MICRO-LENS ARRAY SEPARATED WITH TRENCH STRUCTURES AND METHOD OF MAKING

(75) Inventor: Katsumi Yamamoto, Shanghai (CN)

(73) Assignee: OmniVision International Holding Ltd, Cayman Islands (KN)

( * ) Notice: Subject to any disclaimer, the term of this patent is extended or adjusted under 35 U.S.C. 154(b) by 0 days.

(21) Appl. No.: 10/918,021

(22) Filed: Aug. 13, 2004

(65) Prior Publication Data

US 2005/0017278 A1 Jan. 27, 2005

Related U.S. Application Data

(63) Continuation of application No. 10/603,727, filed on Jun. 24, 2003, now Pat. No. 6,818,934.

(51) Int. Cl.[7] ............................................. H01L 31/062
(52) U.S. Cl. ....................................... 257/294; 257/432
(58) Field of Search .................................. 257/222, 225, 257/291, 294, 432

(56) References Cited

U.S. PATENT DOCUMENTS

| 5,371,384 | A | | 12/1994 | Wada |
| 5,768,023 | A | | 6/1998 | Sawaki et al. |
| 6,274,917 | B1 | | 8/2001 | Fan et al. |
| 6,297,071 | B1 | | 10/2001 | Wake |
| 6,577,342 | B1 | * | 6/2003 | Wester ........................ 348/340 |
| 6,818,934 | B1 | * | 11/2004 | Yamamoto ................... 257/294 |

* cited by examiner

Primary Examiner—Mark V. Prenty
(74) Attorney, Agent, or Firm—Perkins Coie LLP

(57) ABSTRACT

An image sensor having micro-lenses is disclosed. The image sensor comprises a plurality of pixels formed in a semiconductor substrate, each pixel including a light sensitive element. A micro-lens is formed over each of the light sensitive elements. Finally, a trench structure surrounds each of the micro-lenses.

8 Claims, 6 Drawing Sheets

IMAGE SENSOR HAVING MICRO-LENS ARRAY SEPARATED WITH TRENCH STRUCTURES AND METHOD OF MAKING

This application is a continuation of U.S. patent application Ser. No. 10/603,727, filed Jun. 24, 2003 and U.S. Pat. No. 6,818,934, which is hereby incorporated by reference in its entirety, and to which priorty is claimed.

TECHNICAL FIELD

The present invention relates to image sensors, and more particularly, towards an image sensor that has a micro-lens array that is separated by trenches.

BACKGROUND

Image sensors are electronic integrated circuits that can be used to produce still or video images. Solid state image sensors can be either of the charge coupled device (CCD) type or the complimentary metal oxide semiconductor (CMOS) type. In either type of image sensor, a light gathering pixel is formed in a substrate and arranged in a two-dimensional array. Modern image sensors typically contain millions of pixels to provide a high-resolution image. An important part of the image sensor are the color filters and micro-lens structures formed atop of the pixels. The color filters, as the name implies, are operative, in conjunction with signal processing, to provide a color image. Examples of color filter technology are shown in U.S. Pat. No. 6,297,071 and U.S. Pat. No. 6,274,917 (and the references cited therein). The micro-lenses serve to focus the incident light onto the pixels, and thus to improve the fill factor of each pixel.

Conventionally, micro-lenses are formed by spin coating a layer of micro-lens material onto a planarized layer. The micro-lens material is then etched to form cylindrical or other shaped regions that are centered above each pixel. Then, the micro-lens material is heated and reflowed to form a convex hemispherical micro-lens. FIG. 1 shows a prior art cross-sectional simplified diagram of an image sensor 101 having micro-lenses formed thereon. As seen in FIG. 1, the image sensor includes a plurality of pixels that have light detecting elements 103 formed in the substrate. The light detecting elements 103 may be one of several types, such as a photodiode, a photogate, or other solid state light sensitive element. Formed atop of each pixel is a micro-lens 105. The micro-lens 105 focuses incident light onto the light detecting elements 103. Moreover, in the region between the light detecting elements 103 and the micro-lens 105, denoted by reference numeral 107, there are various intervening layers that would typically include the color filter layers and various metal conducting lines.

The formation of the micro-lenses is a relatively precise process. In order to increase the efficiency of the light gathering aspect of the micro-lenses, the micro-lenses should be as large as possible. Still, it is undesirable for the individual micro-lenses to contact each other and thereby interfere. In sum, it is desired that the micro-lenses be as close to each other as possible with touching.

While this may be accomplished by precisely controlling the formation, size, and shape of the microlens cylindrical "blank", as well as by controlling the reflow process, it is still difficult to ensure the formation of nearly perfect micro-lenses.

DETAILED DESCRIPTION

The present invention relates to a micro-lens array for use with image sensors, either of the CMOS or CCD type. In the following description, numerous specific details are provided to provide a thorough understanding of the embodiments of the invention. One skilled in the relevant art will recognize, however, that the invention can be practiced without one or more of the specific details, or with other methods, components, etc. In other instances, well-known structures or operations are not shown or described in detail to avoid obscuring aspects of various embodiments of the invention.

Reference throughout the specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout the specification are not necessarily all referring to the same embodiment. Furthermore, the particular features, structures, or characteristics may be combined in any suitable manner in one or more embodiments.

Figure 1:
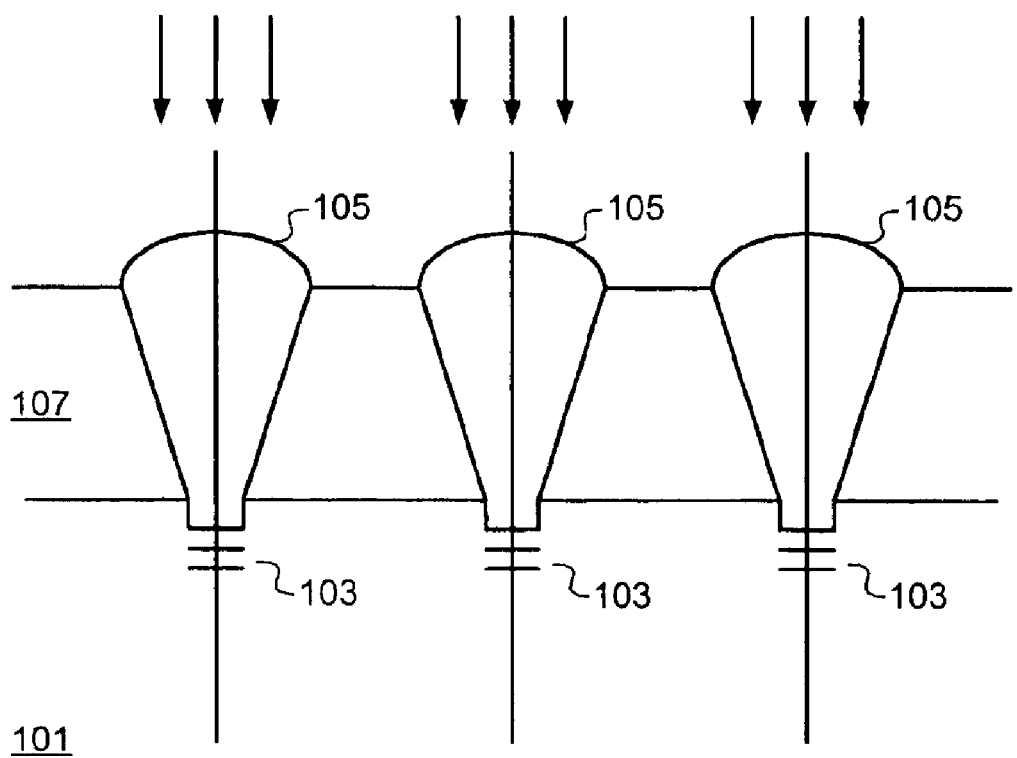
FIG. 1 is a prior art cross sectional view of a portion of an image sensor.
Figure 2:
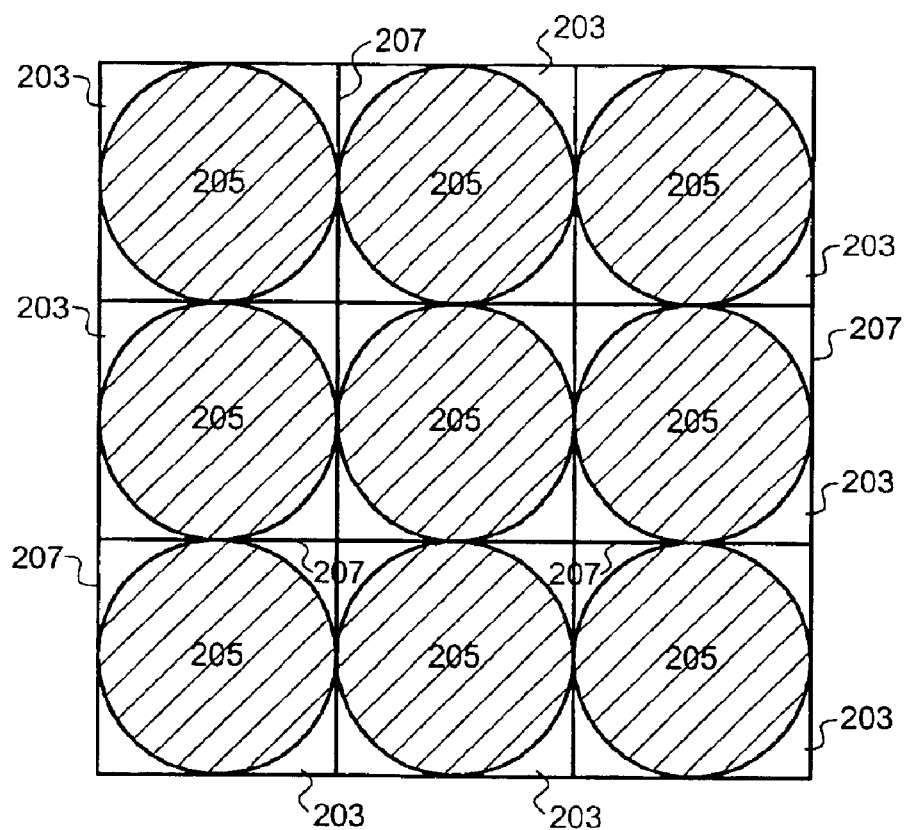
FIG. 2 is a top view of an image sensor showing pixels arranged in a two-dimensional array and with micro-lenses formed thereon.

FIG. 2 shows a top view of an image sensor 201 formed in accordance with the present invention. The image sensor 201 includes a plurality of pixels 203 typically arranged in a two dimensional array. In the example shown in FIG. 2, the image sensor shows a three by three array of pixels 203, though it can be appreciated that an actual image sensor 201 would have many more pixels, arranged in perhaps over a thousand rows and/or a thousand columns. Further, although FIG. 2 shows the pixels in ordered columns and rows, the pixels may be arranged in any type of ordered arrangement. For example, alternating rows may have their pixels slightly offset from each other laterally in a checkerboard format.

The pixels 203 typically include a light sensitive element, such as a photodiode or a photogate as two examples. However, it can be appreciated that other types of light sensitive elements, now known or developed in the future, may be used. Further, the pixels 203 will also include amplification and/or readout circuitry. For clarity, this circuitry is not shown in FIG. 2. In one embodiment, the pixels 203 may be active pixels, commonly known in the prior art. Formed atop of each pixel 203 is a micro-lens 205. Further, separating the individual micro-lenses is a trench structure 207. As the name implies, the trench structure 207 is moat-like area that serves as a barrier separating the micro-lenses. As will be seen in greater detail below, the micro-lenses 205 are prevented from "overflowing" (during the reflow process) to the neighboring micro-lenses by the trench structure 207. The trench structure 207 may take a variety of shapes, but should serve to separate neighboring pixels.

FIGS. 3–7 show in greater detail the formation and structure of the combination micro-lenses 205 and trench structure 207 of the present invention. A semiconductor substrate 301 has a plurality of light sensitive elements 303 (associated with the pixels 203 of FIG. 2) formed therein.

Figure 3:
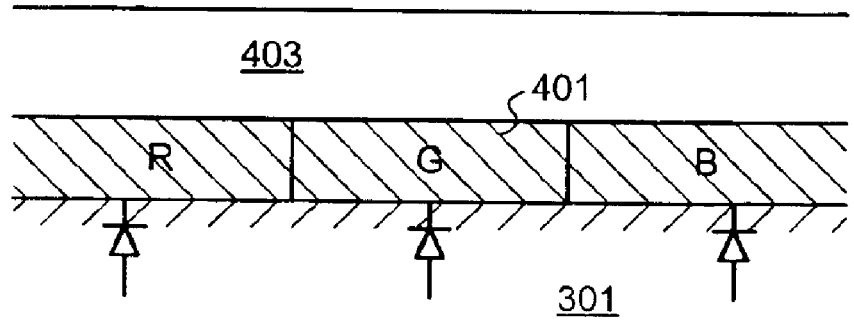
FIGS. 3–4 and 6–8 are cross sectional views of a semiconductor substrate illustrating one method for forming the apparatus of the present invention.

FIG. 3 shows the light sensitive element 303 as a photodiode, though other substitutes and equivalents may be used. Details of forming the photodiode and other associated circuitry are known in the prior art and will not be repeated herein to avoid obscuring the present invention. However, examples of the prior art may be seen in U.S. Pat. No. 5,904,493 and U.S. Pat. No. 6,320,617.

Formed atop of the light sensitive elements 303 are color filters. In accordance with one embodiment of the present invention, a planar color filter layer 401 is deposited over the substrate 301 and light sensitive elements 303. It should be noted that while in this particular embodiment, the color filter layer 401 is formed directly over the substrate 301, in other embodiments, the color filter layer 401 is formed over an intermediate layer or layers, depending upon the particular process used. For example, in some instances, a planarizing dielectric layer is formed over the substrate, or in other instances, conductive metal layers and insulating layers are formed over the substrate.

The color filter layer 401 is composed of three separate color layers that have been patterned and etched to form the color filter layer 401. In one embodiment, the color filter layer 401 includes red, green, and blue colors. In another embodiment, the color filter layer 401 includes yellow, cyan, and magenta colors. The color filter layer 401 is formed from a pigmented or dyed material that will only allow a narrow band of light to pass therethrough, for example, red, blue, or green. In other embodiments, the color filter may be cyan, yellow, or magenta. These are but example colors for the color filter layer 401 and the present invention is meant to encompass a color filter layer 401 having any combination of color.

Further, while the use of pigmented or dyed color materials is the most prevalent form of color filters, other reflective type color filters may be used, such as a multilayer stack reflective material. The formation of color filter layer 401 is known in art and will not be described herein to avoid any unnecessary obscuration with the description of the present invention. For example, U.S. Pat. No. 6,297,071, U.S. Pat. No. 6,362,513, and U.S. Pat. No. 6,271,900 show the current state of the color filter art.

Typically, the color filter layer 401 is formed from a material such as an acrylic. For example, a suitable material is polymethylmethacrylate (PMMA) or polyglycidylmethacrylate (PGMA) that has been pigmented or dyed. Other photoresist-type materials that can be dyed or pigmented may also be used for the color filter layer 401.

Still referring to FIG. 3, a top planarizing layer 403 is formed. The top planarizing layer 401 is formed from a dielctric material, such as an oxide formed by a blanket chemical vapor deposition process.

Figure 4:
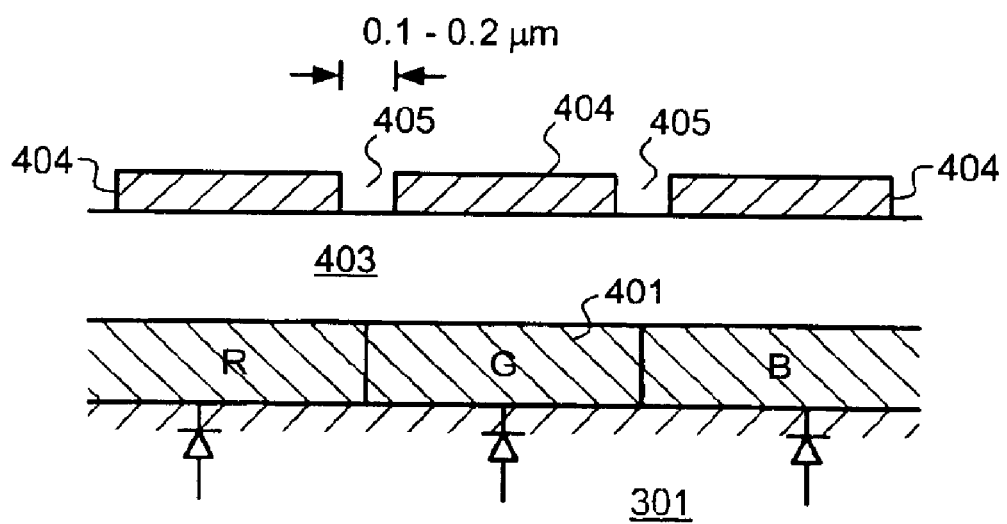

Turning to FIG. 4, a photoresist layer 404 is deposited over the top planarizing layer 403 and patterned to leave photoresist gaps 405. The photoresist gaps 405 are placed in locations such that the pattern formed by the photoresist gaps 405 serves to separate neighboring underlying pixels. Therefore, the photoresist gaps 405 should act as a moat for the individual micro-lens to be formed. In some embodiments, the photoresist gaps 405 should be formed as a quadrilateral (such as that shown in FIG. 2), or in other embodiments, be formed as a circle, so as to more clearly define the micro-lens shape. Other shapes are also possible.

Figure 5:
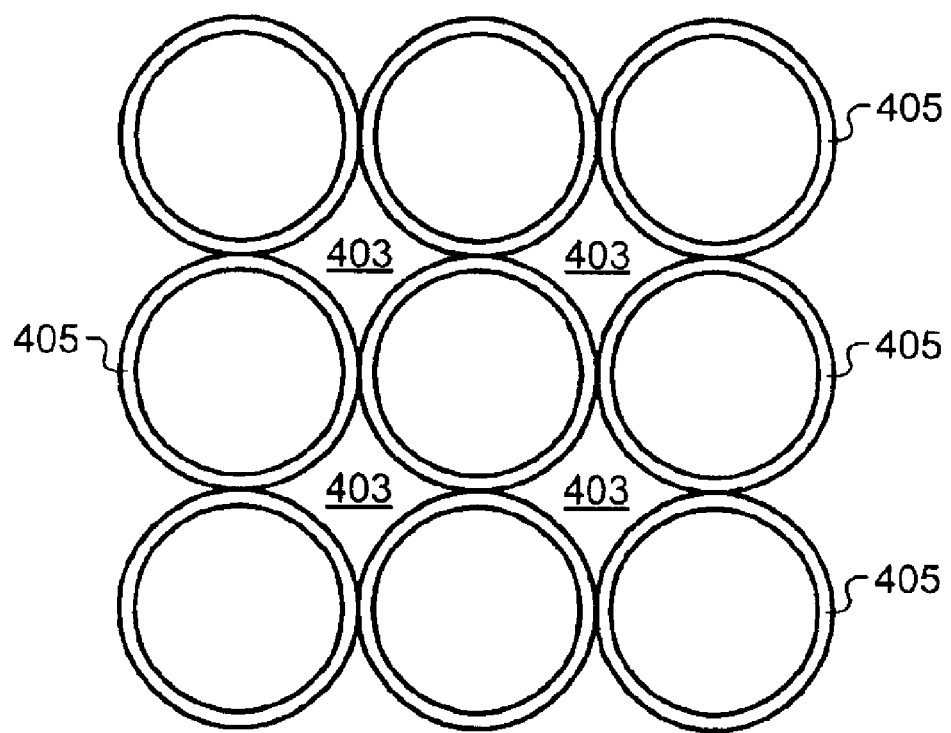
FIG. 5 is a top view of circular triangular ridges formed over pixels of an image sensor.

FIG. 5 shows a top view of the photoresist gaps 405 if formed in a circular shape.

As seen in FIG. 5, the photoresist gaps 405 form a plurality of circular rings that will serve to contain a subsequently formed micro-lens.

In one embodiment, the photoresist gaps 405 have a width of about 0.1–0.2 microns, though thinner structures can be used. Further, the depth of the photoresist trenches 405 may vary widely, but in one embodiment may be on the order of 0.5 to 1 micron in height.

Further, one example of a suitable photoresist material is Tokyo Ohka Kogyo's OFPR-800 positive photoresist. The photoresist may be coated onto the top planarizing layer 403 by means of a spin on technique. It can be appreciated that other photoresists may be used, such as an i-line photoresist. The photoresist layer is then patterned using conventional photolithography and development techniques, such as for example using an i-line stepper.

Figure 6:
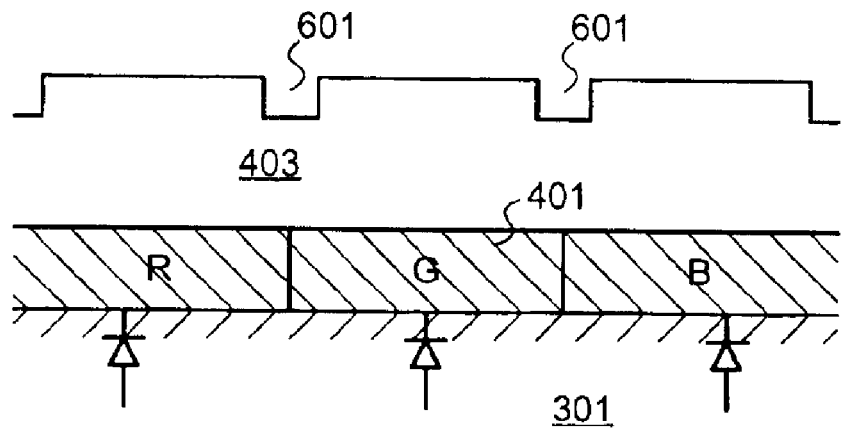

Next, turning to FIG. 6, in one embodiment, an anisotropic dry etching process is performed on the top planarizing layer 403 and the photoresist layer 404. This results in the formation of trenches 601. In one embodiment, the etching process is controlled such that the depth of the trenches 601 is on the order of 0.2 microns.

Figure 7:
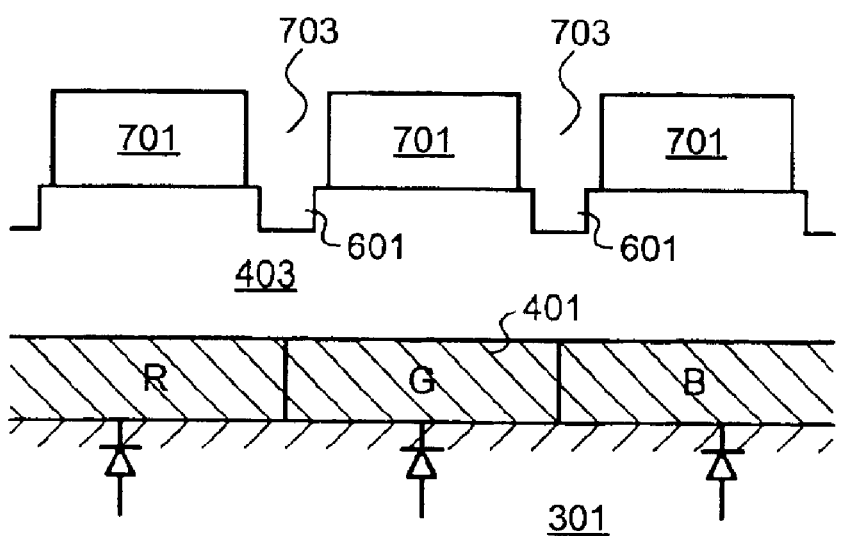

Next, turning to FIG. 7, a micro-lens material is formed over the top planarizing layer 403 and the trenches 601. The micro-lens material may be any material that is optically transparent and subject to formation into a hemispherical shape by processes. For example, some common micro-lens material may be an acrylic, such as polymethylmethacrylate (PMMA) or polyglycidylmethacrylate (PGMA). However, it can be appreciated that the precise material used to form the micro-lenses is variable, and may be any currently used or future material.

In one embodiment, the micro-lens material may be a material in liquid state during application such that it can be applied using spin on techniques. This provides the advantage of forming a substantially planar layer. Nevertheless, other blanket deposition methods may also be suitable. In one embodiment, the thickness of the micro-lens material is on the order of 1 to 4 microns. However, thinner or thicker layers of the micro-lens material may also be used, depending on various design parameters.

Still referring to FIG. 7, the micro-lens layer will need to be patterned. Because of this, it is efficient to use a photoresist type material as the micro-lens material. In that way, the micro-lens material can be "directly patterned" by simply the use of a photolithography apparatus and a developing process. In one embodiment, the photolithography is performed by a reduction type stepper apparatus.

Where the micro-lens material is a photoresist, the micro-lens material is exposed using a reticle mask and stepper apparatus. The reticle mask is designed such that gap sections 703 are exposed to the photolithographic radiation (in the case of a positive photoresist). Thus, when developed, gap sections 703 will be removed, leaving blocks of micro-lens material 701, generally over the light detecting elements and between the trenches 601.

Figure 8:
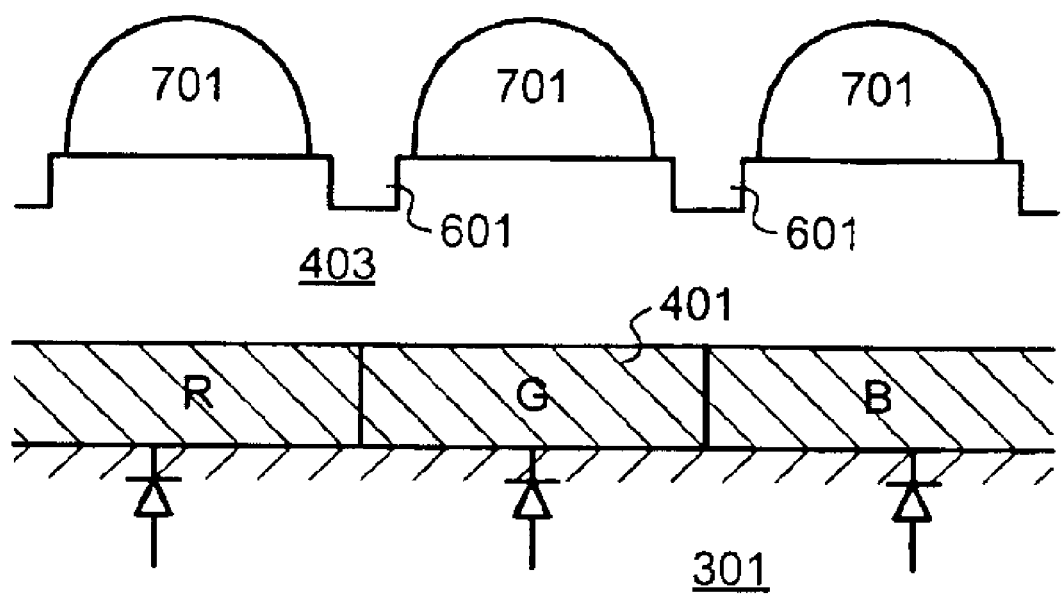

Turning to FIG. 8, once the micro-lens material has been developed (in the case of the micro-lens material being a photoresist), the remaining portions of the micro-lens material 701 are heated to a reflow temperature. This causes the micro-lens material 701 to adopt a minimum surface tension shape, which results in a spherical shape, as shown in FIG. 8. As seen in FIG. 8, the individual micro-lens are confined by the trenches 601 after the reflow process. It has been found that the trenches 601 contain the micro-lenses during the reflow process.

Using the structure and method described herein, the amount of crosstalk between adjacent micro-lens structures is reduced as a result of the trenches 601. Further, because of the trenches 601, there is a greater process margin during the micro-lens formation process. Moreover, the use of the separating ridges reduces the gaps between micro-lenses, increases the precision of the micro-lens placement, and provided other advantages.

From the foregoing, it will be appreciated that specific embodiments of the invention have been described herein for purposes of illustration, but that various modifications may be made without deviating from the spirit and scope of the invention. Accordingly, the invention is not limited except as by the appended claims. Thus, while these steps are shown in a particular order, in some embodiments these steps are re-arranged, and some steps may be deleted, moved, added, subdivided, combined, and/or modified. Each of these steps may be implemented in a variety of different ways. Also, while these steps are shown as being performed in series, these steps may instead be performed in parallel, or may be performed at different times.

I claim:

1. An image sensor comprising:
    a plurality of pixels formed in a semiconductor substrate, each pixel including a light sensitive element;
    a layer formed over said light sensitive elements;
    a micro-lens over each of said light sensitive elements and directly atop said layer; and
    a trench structure surrounding each of said micro-lens, said trench structure formed in the top of said layer and extending to the interface between said layer and said micro-lens, said trench structure separating said micro-lens from its adjacent micro-lenses, wherein said trench structure is circular.

2. The image sensor of claim 1 wherein the micro-lenss are formed from polymethylmethacrylate (PMMA) or polyglycidylmethacrylate (PGMA).

3. The image sensor of claim 1 wherein said trench structure is formed in a layer that underlies said micro-lenses.

4. The image sensor of claim 1 further including a color filter layer between said micro-lenss and said light sensitive elements.

5. A pixel of an image sensor comprising:
    a light sensitive element formed in a semiconductor substrate;
    a layer formed over said light sensitive element;
    a micro-lens over said light sensitive element and directly atop said layer; and
    a trench structure surrounding each of said micro-lens, said trench structure formed in the top of said layer and extending to the interface between said layer and said micro-lens, said trench structure separating said micro-lenses from its adjacent micro-lens, wherein said trench structure is circular.

6. The pixel of claim 5 wherein the micro-lens is formed from polymethylmethacrylate (PMMA) or polyglycidylmethacrylate (PGMA).

7. The pixel of claim 5 wherein said trench structure is formed in the material that underlies said micro-lenses.

8. The pixel of claim 5 further including a color filter layer between said micro-lenss and said light sensitive elements.

* * * * *